(12) United States Patent  
Chang et al.

(10) Patent No.: US 11,419,221 B2  
(45) Date of Patent: Aug. 16, 2022

(54) METHOD OF FORMING PROTECTIVE FILM ON AT LEAST ONE ELECTRONIC MODULE

(71) Applicant: ELEADTK CO., LTD., Hsinchu County (TW)

(72) Inventors: Ching-Nan Chang, Hsinchu County (TW); Sheng-Yu Lin, Hsinchu County (TW); Ming-Chan Chen, Hsinchu County (TW)

(73) Assignee: ELEADTK CO., LTD., Hsinchu County (TW)

( * ) Notice: Subject to any disclaimer, the term of this patent is extended or adjusted under 35 U.S.C. 154(b) by 728 days.

(21) Appl. No.: 16/393,968

(22) Filed: Apr. 25, 2019

(65) Prior Publication Data

US 2019/0343004 A1    Nov. 7, 2019

Related U.S. Application Data

(60) Provisional application No. 62/665,537, filed on May 2, 2018.

(30) Foreign Application Priority Data

Jul. 26, 2018    (CN) .......................... 201810836095.9

(51) Int. Cl.
*B29C 51/10* (2006.01)
*H05K 3/28* (2006.01)
(Continued)

(52) U.S. Cl.
CPC ............. *H05K 3/284* (2013.01); *B29C 51/10* (2013.01); *B29C 51/16* (2013.01); *H05K 1/181* (2013.01);
(Continued)

(58) Field of Classification Search
CPC ................................ B29C 51/10; B29C 51/16
See application file for complete search history.

(56) References Cited

U.S. PATENT DOCUMENTS 6,613,608 B1 *   9/2003   Yamaguchi .......... H01L 23/4985  
                                                      438/126  
7,752,747 B2 *   7/2010   Higuchi ............... H03H 9/1085  
                                                       29/841

(Continued)

FOREIGN PATENT DOCUMENTS

CN   1259009   7/2000  
CN   1638071   7/2005  
(Continued)

OTHER PUBLICATIONS

"Office Action of Germany Counterpart Application", dated Aug. 5, 2021, p. 1-p. 7.
(Continued)

*Primary Examiner* — Edmund H Lee  
(74) *Attorney, Agent, or Firm* — JCIP Global Inc.

(57) ABSTRACT

A method of forming a protective film on at least one electronic module is provided. The method includes the following steps. A protective material is disposed on at least one electronic module such that the protective material and the electronic modules are in contact with each other. The electronic modules and the protective material disposed on the electronic modules are disposed in a chamber, and a first ambient pressure is provided in the chamber. The protective material in the chamber is heated to a first temperature to soften the protective material disposed on the electronic modules. After the protective material is softened, a second ambient pressure greater than the first ambient pressure is provided in the chamber, wherein a gas in the chamber directly pressurizes the protective material such that the protective material conformally covers a top of the elec- (Continued)

tronic modules. The protective material conformally covering the top of the electronic modules is heated to a second temperature to solidify the protective material conformally covering the top of the electronic modules to form a protective film conformally covering the top of the electronic modules.

7 Claims, 4 Drawing Sheets

(51) Int. Cl.
*H05K 1/18* (2006.01)
*B29C 51/16* (2006.01)
*B29L 31/34* (2006.01)
*B29K 101/10* (2006.01)

(52) U.S. Cl.
CPC ... *B29K 2101/10* (2013.01); *B29L 2031/3425* (2013.01); *H05K 2203/085* (2013.01); *H05K 2203/1105* (2013.01)

(56) References Cited

U.S. PATENT DOCUMENTS

| 9,647,189 | B2* | 5/2017 | Tischler | H01L 24/75 |
| 2008/0182117 | A1* | 7/2008 | Iwasa | B29C 55/06 |
| | | | | 428/521 |

FOREIGN PATENT DOCUMENTS

| CN | 2797011 | 7/2006 |
| CN | 107004676 | 8/2017 |
| EP | 0684648 | 9/2000 |
| EP | 1589797 | 10/2005 |
| EP | 3210245 | 4/2019 |
| WO | 2012023119 | 2/2012 |

OTHER PUBLICATIONS

"Office Action of China Counterpart Application", dated Jul. 13, 2020, p. 1-p. 7.

* cited by examiner

METHOD OF FORMING PROTECTIVE FILM ON AT LEAST ONE ELECTRONIC MODULE

CROSS-REFERENCE TO RELATED APPLICATION

This application claims the priority benefits of U.S. provisional application Ser. No. 62/665,537, filed on May 2, 2018, and China application serial no. 201810836095.9, filed on Jul. 26, 2018. The entirety of each of the above-mentioned patent applications is hereby incorporated by reference herein and made a part of this specification.

BACKGROUND

Technical Field

The invention relates to a method of forming a protective film on at least one electronic module, and in particular, to a method of forming a protective film on at least one electronic module via a method of pressurizing via a high-pressure gas.

Description of Related Art

Electronic components of different sizes are often disposed on a regular motherboard for an electronic device. A traditional method involves attaching a protective adhesive to the motherboard via a mechanical or manual method to protect the motherboard and the electronic components on the motherboard. However, in the method above, since the protective adhesive does not adhere tightly, residual bubbles are often present between the protective adhesive and the motherboard or between the protective adhesive and the electronic components. Therefore, water vapor coating often occurs, such that the life of the electronic components is reduced or the reliability thereof is compromised.

SUMMARY

The invention provides a method of forming a protective film on at least one electronic module. Via the method of the invention, the electronic modules and/or the protective film conformally covering a top of a circuit board may have good performance and good quality.

An embodiment of the invention provides a method of forming a protective film on at least one electronic module. The method includes the following steps. At least one electronic module and a protective material disposed on the electronic modules are disposed in a chamber, wherein the protective material and the electronic modules are in contact with each other. A first heating process is performed on the protective material in the chamber to soften the protective material disposed on the electronic modules, and a gas decompression process is performed on the chamber. A second heating process is performed on the protective material in the chamber after the protective material is softened, and a boost process is performed on the chamber, wherein in the boost process, a gas in the chamber directly pressurizes the protective material such that the protective material conformally covers a top of the electronic modules. The protective material conformally covering the top of the electronic modules is solidified to form the protective film conformally covering the top of the electronic modules.

In the method of forming the protective film on the at least one electronic module according to an embodiment of the invention, the electronic modules include a circuit board and a plurality of electronic devices. The plurality of electronic devices are disposed on the circuit board. In the step of disposing the electronic modules and the protective material disposed on the electronic modules in the chamber, the protective material is at least in contact with the plurality of electronic devices.

In the method of forming the protective film on the at least one electronic module according to an embodiment of the invention, an area of the electronic modules is greater than or equal to an area of the protective material. In the step of disposing the electronic modules and the protective material disposed on the electronic modules in the chamber, the protective material does not cover a sidewall of the electronic modules.

In the method of forming the protective film on the at least one electronic module according to an embodiment of the invention, the first heating process involves heating the protective material to a first temperature. The first temperature is greater than or equal to a softening point of the protective material, and the first temperature is less than a solidifying point of the protective material. The second heating process involves heating the protective material to a second temperature, and the second temperature is greater than the solidifying point of the protective material.

In the method of forming the protective film on the at least one electronic module according to an embodiment of the invention, the first temperature is greater than 50° C.

In the method of forming the protective film on the at least one electronic module according to an embodiment of the invention, the gas decompression process involves reducing a gas pressure in the chamber to a first ambient pressure, wherein the first ambient pressure is less than a gas pressure outside the chamber. The boost process involves increasing the gas pressure in the chamber to a second ambient pressure, wherein the second ambient pressure is higher than the gas pressure outside the chamber.

In the method of forming the protective film on the at least one electronic module according to an embodiment of the invention, the first heating process and the gas decompression process are performed at the same time.

In the method of forming the protective film on the at least one electronic module according to an embodiment of the invention, the second heating process and the boost process are performed at the same time.

In the method of forming the protective film on the at least one electronic module according to an embodiment of the invention, the chamber, a boost unit, a pumping unit, and a heating unit form a device. The boost unit and the pumping unit are linked to the chamber. The heating unit is thermally coupled to the chamber.

In the method of forming the protective film on the at least one electronic module according to an embodiment of the invention, the at least one electronic module is a plurality of electronic modules, and at least two of the plurality of electronic modules are overlapped with each other in the chamber.

In the forming process of the protective film using the protective material of the invention, the protective material conformally covers the top of the electronic modules by a method of pressurizing via a high-pressure gas. Therefore, the electronic modules and/or the protective film conformally covering the circuit board are not readily damaged, and the electronic modules and/or conformally covering the circuit board have good performance and good quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure. The shape, size, scale, or proportion of the elements in the figures may be exaggerated to better emphasize features.

DESCRIPTION OF THE EMBODIMENTS

Hereinafter, exemplary embodiments of the invention are described in detail, and examples of the exemplary embodiments are conveyed via the figures. Wherever possible, the same reference numerals are used in the figures and the descriptions to refer to the same or similar portions.

Figure 1:
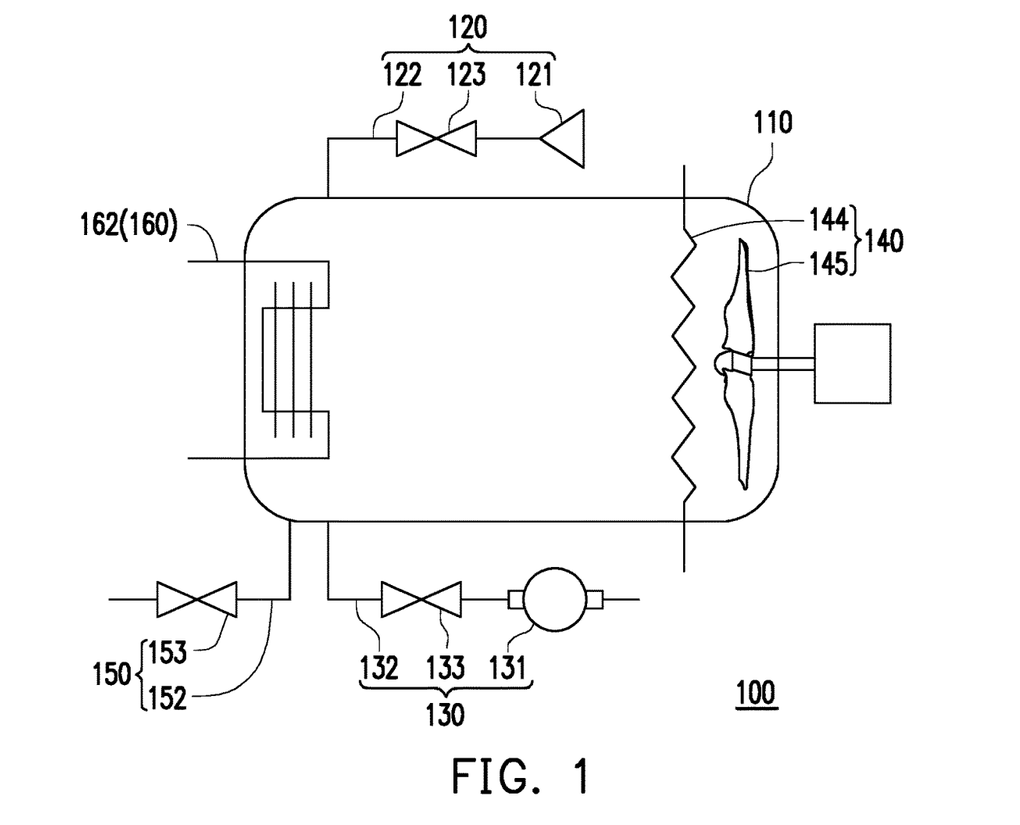
FIG. 1 is a schematic showing a device for forming a protective film on at least one electronic module according to one embodiment of the disclosure.

FIG. 1 is a schematic showing a device for forming a protective film on at least one electronic module according to one embodiment of the disclosure.

First, referring to FIG. 1, an apparatus 100 that may be used to form a protective film 310 (shown in FIG. 4D) on one or a plurality of electronic modules 200 (shown in FIG. 4D) is schematically provided. The apparatus 100 includes a chamber 110, a boost unit 120, a pumping unit 130, and a heating unit 140.

The chamber 110 may have a corresponding door (not shown), the hatch may be opened to link the space in the chamber 110 with the space outside the chamber 110, and the hatch may be closed to form a closed space in the chamber 110. The hatch is an element common to the chamber 110, and therefore is not specifically shown in FIG. 1.

The boost unit 120 may include, for instance, a high-pressure gas source 121, a pipeline 122, and a valve 123. The high-pressure gas source 121 may include, for instance, a high-pressure gas steel cylinder or a booster pump. The pipeline 122 is linked between the high-pressure gas source 121 and the chamber 110. The valve 123 is located on the pipeline 122. If the valve 123 is open, then the gas of the high-pressure gas source 121 may enter the chamber 110 via the pipeline 122. Via the boost unit 120, the gas pressure in the chamber 110 may be greater than the gas pressure outside the chamber 110. The gas pressure outside the chamber 110 is generally 1 atm.

The pumping unit 130 may include, for instance, a pump 131, a pipeline 132, and a valve 133. The pipeline 132 is linked between the pump 131 and the chamber 110. The valve 133 is located on the pipeline 132. If the valve 133 and the pump 131 are open, then the gas in the chamber 110 may be sucked out of the chamber 110 via the pipeline 132 and the pump 131. Via the pumping unit 130, the gas pressure in the chamber 110 may be less than the gas pressure outside the chamber 110.

The heating unit 140 may include, for instance, a heating resistor 144 and an electric fan 145. The heating resistor 144 may heat an object in the chamber 110 via a method of thermal radiation. Alternatively, when the chamber 110 contains a gas, the object in the chamber 110 may be heated via a gas convection method or by circulating the gas in the chamber 110 via an electric fan 145. Via the heating unit 140, the temperature in the chamber 110 may be greater than the temperature outside the chamber 110.

In the present embodiment, the apparatus 100 not only includes the chamber 110, the boost unit 120, the pumping unit 130, and the heating unit 140, but may also include an escape unit 150 and/or a cooling unit 160.

The escape unit 150 may include a pipeline 152 and a valve 153. The pipeline 152 is linked between the space outside the chamber 110 and the space in the chamber 110. The valve 153 is located on the pipeline 152. When the gas pressure in the chamber 110 is higher than the gas pressure outside the chamber 110, the gas in the chamber 110 may directly be discharged out of the chamber 110 via the open valve 153 and pipeline 152 via the escape unit 150. In other embodiments, if the apparatus 100 does not have the escape unit 150, then the gas in the chamber 110 may also be discharged via the pumping unit 130.

The cooling unit 160 may include a pipeline 162 containing a coolant. The coolant is, for instance, water, or water or refrigerant including antifreeze, but the invention is not limited thereto. In the embodiment shown in FIG. 1, a portion of the cooling unit 160 may be located in the chamber 110, and the object in the chamber 110 may be cooled via a method of gas convection or gas circulation via thermal radiation when the chamber 110 contains a gas. In other embodiments, if the apparatus 100 does not have the cooling unit 160, then cooling to room temperature may also be achieved in a natural state. Via the cooling unit 160, the temperature in the chamber 110 may be less than the temperature outside the chamber 110. Alternatively, when the temperature in the chamber 110 is greater than the temperature outside the chamber 110, the temperature in the chamber 110 may be rapidly reduced close to the temperature outside the chamber 110. Alternatively, the temperature in the chamber 110 may be further less than the temperature outside the chamber 110.

Figure 2:
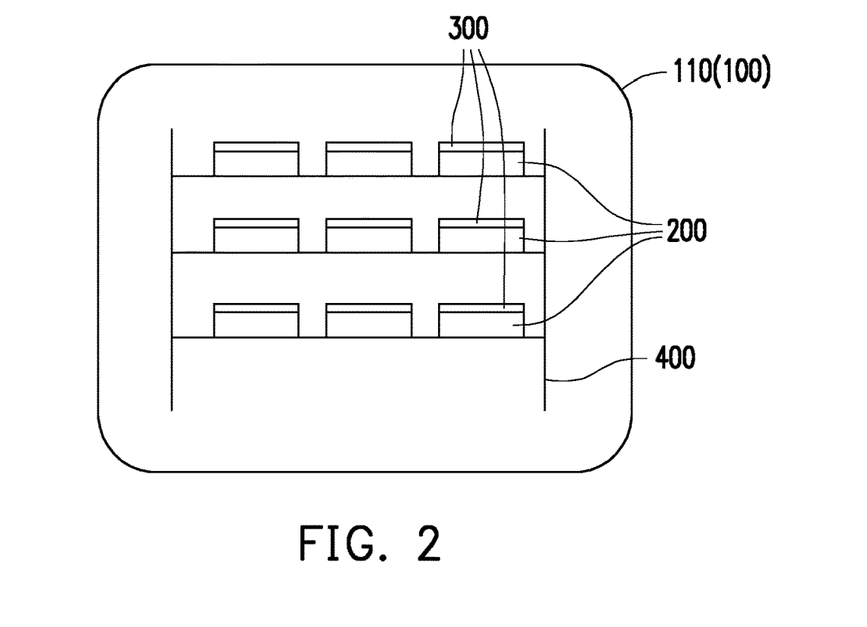
FIG. 2 is a schematic showing a method of forming a protective film on electronic modules via a device according to one embodiment of the disclosure.
Figure 3:
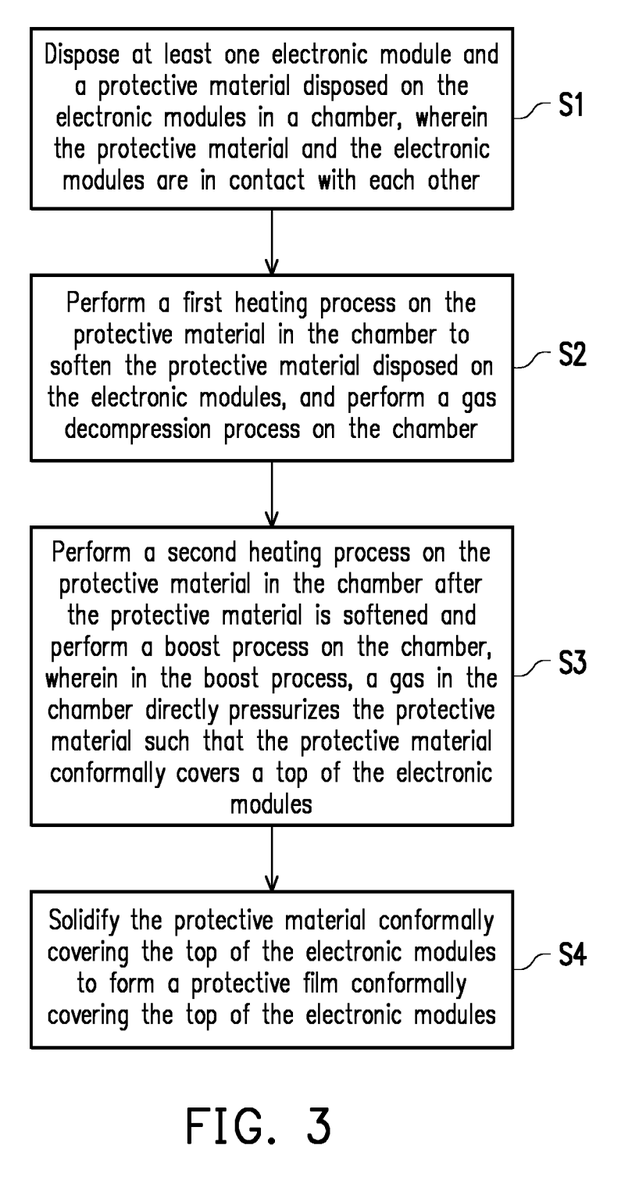
FIG. 3 is a flowchart showing a method of forming a protective film on at least one electronic module according to one embodiment of the disclosure.
Figure 4A:
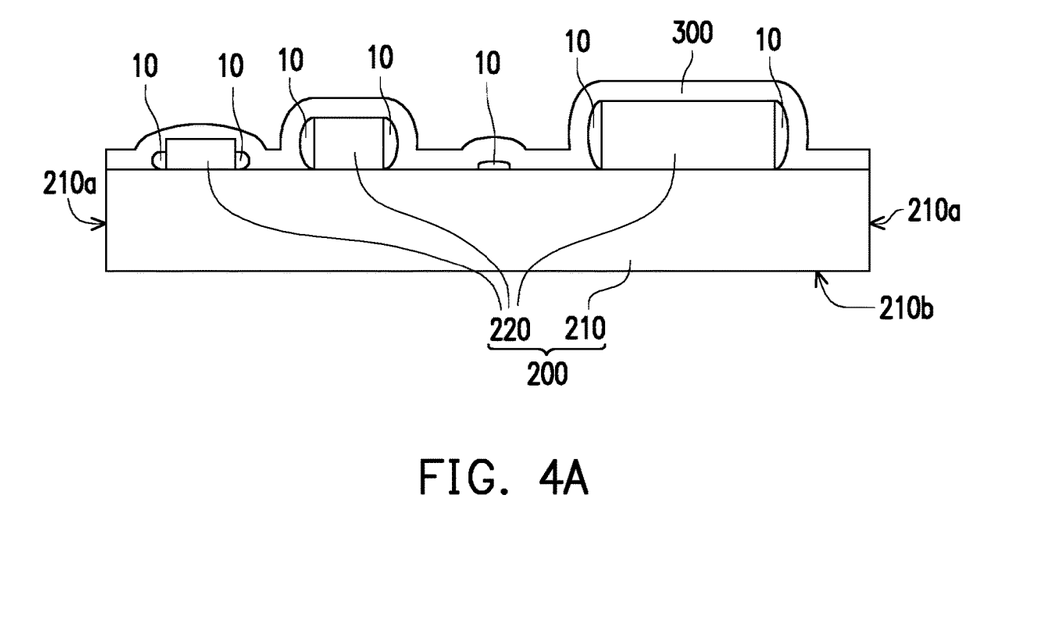
FIG. 4A to FIG. 4D show cross sections of the steps of a method of forming a protective film on electronic modules according to one embodiment of the disclosure.
Figure 4B:
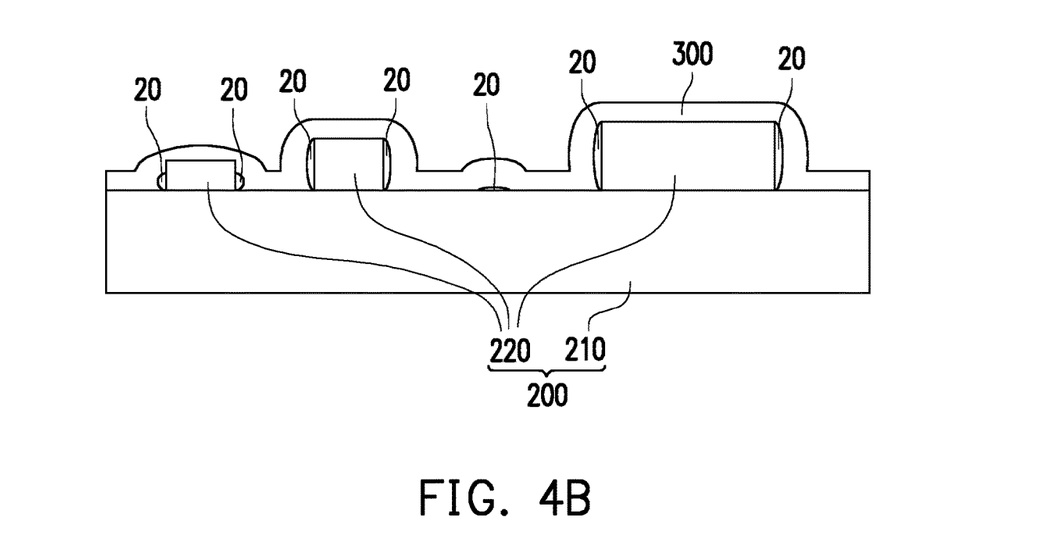
Figure 4C:
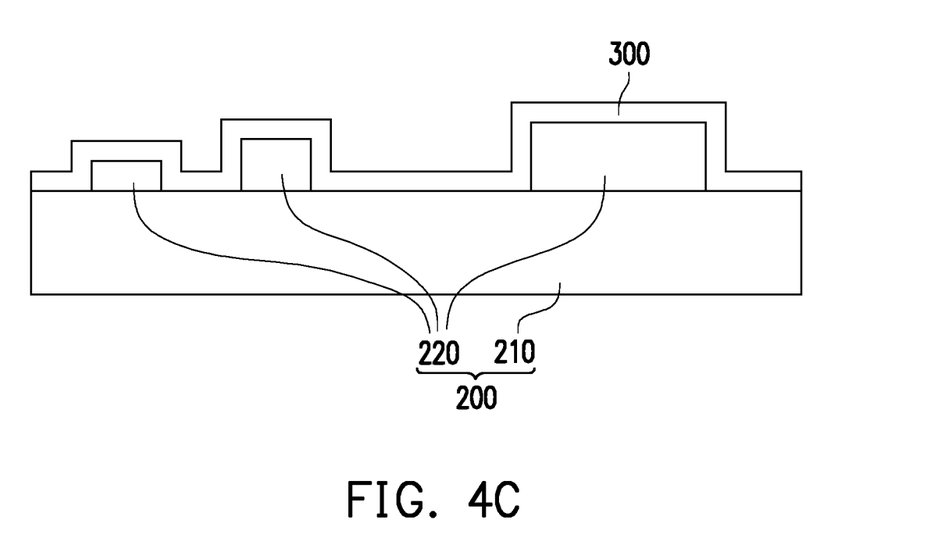

FIG. 2 is a schematic showing a method of forming a protective film on electronic modules via a device according to one embodiment of the disclosure. FIG. 3 is a flowchart showing a method of forming a protective film on at least one electronic module according to one embodiment of the disclosure. FIG. 4A to FIG. 4C show cross sections of the steps of a method of forming a protective film on electronic modules according to one embodiment of the disclosure. Moreover, for clarity, FIG. 2 omits a portion of the elements in the apparatus 100 (such as the boost unit 120, the pumping unit 130, and the heating unit 140), or a portion of the elements in the electronic modules 200 (such as the plurality of electronic components 220).

Referring to FIG. 2, in the present embodiment, the electronic modules 200 and the protective material 300 disposed on the electronic modules 200 may be disposed in the chamber 110 to form the protective film 310 on the electronic modules 200 via the apparatus 100. As shown in FIG. 2, a separator 400 may be disposed in the chamber 100, the plurality of electronic modules 200 may be disposed in the chamber 110, and at least two of the plurality of electronic modules 200 may be overlapped with each other in the chamber 110 via the separator 400 and not be in contact in the vertical direction (i.e., the gravity direction).

Refer to all of FIG. 1 to FIG. 3 and FIG. 4A. First, in step S1, the electronic modules 200 and the protective material 300 disposed on the electronic modules 200 are disposed in the chamber 110, wherein the protective material 300 and the electronic modules 200 are in contact with each other.

In the present embodiment, the electronic modules 200 include a circuit board 210 and a plurality of electronic components 220. The electronic components 220 are disposed on the circuit board 210. The size or function between the plurality of electronic components 220 may be the same or different, and the invention is not limited in this regard. The electronic components 220 may be electrically connected to the circuit board 210. For instance, the electronic modules 200 may include a motherboard, and the plurality of electronic components 220 may include an active device (such as a chip) an/or a passive component (such as a capacitor or an inductor) disposed on the circuit board 210.

In the present embodiment, the protective material 300 naturally covers the top of the electronic modules 200 via gravity ("top" refers to being in a particular state of gravity). Of course, after the protective material 300 naturally covers the top of the electronic modules 200 via gravity, the protective material 300 and the electronic modules 200 are adhered to each other only via a Van der Waals force or an electrostatic force. Therefore, if needed, the protective material 300 may be removed from the electronic modules 200 without applying a large peel force.

In the present embodiment, the electronic components 220 are disposed on the circuit board 210. Therefore, after the protective material 300 is disposed on the electronic modules 200, the protective material 300 is at least in contact with a portion of the electronic components 220. Moreover, in the present embodiment, the protective material 300 not only is in contact with a portion of the electronic components 220, but may also be in contact with a portion of the circuit board 210, and the invention is not limited in this regard.

When viewed from the top, the area of the electronic modules 200 is greater than or equal to the area of the protective material 300. In other words, after the protective material 300 is disposed on the electronic modules 200, the protective material 300 does not need to cover a sidewall 210a or a bottom 210b of the circuit board 210.

In the present embodiment, the material of the protective material 300 is a thermosetting polymer, and the invention is not limited in this regard. The thermosetting polymer may include, for instance, a bulk molding compound (BMC), a diallyl phthalate (DAP) resin, a urea formaldehyde (UF) resin, or a phenolic resin, but the invention is not limited in this regard.

In the present embodiment, the protective material 300 may be first disposed on the electronic modules 200 outside the chamber 110, and then the electronic modules 200 and the protective material 300 disposed on the electronic modules 200 are disposed in the chamber 110 together, but the invention is not limited thereto. In other embodiments, the electronic modules 200 may also first be disposed in the chamber 110, and then the protective material 300 is disposed on the corresponding electronic modules 200 disposed in the chamber 110.

Moreover, after one or a plurality of electronic modules 200 for which the top is covered by the protective material 300 is disposed in the chamber 110 of the apparatus 100, a closed space may be formed in the chamber 110. At this point, the gas pressure in the chamber 110 is substantially equal to the ambient pressure outside the chamber 110, but the invention is not limited thereto. For instance, if the apparatus 100 has a purge gas pipeline linked to the chamber 110, then after a closed space is formed in the chamber 110, the pressure in the chamber 110 may be slightly greater than the ambient pressure outside the chamber 110.

In the present embodiment, the protective material 300 directly covers the top of the electronic modules 200, and the protective material 300 is a flexible film layer at room temperature. Therefore, some gas gaps 10 may be present between the protective material 300 and the electronic modules 200.

Refer to all of FIG. 1 to FIG. 3 and FIG. 4B. In step S2, a first heating process is performed on the protective material 300 in the chamber 110 to soften the protective material 300 disposed on the electronic modules 200, and a gas decompression process is performed on the chamber 110.

In the present embodiment, the first heating process may be performed via the heating unit 140 of the apparatus 100. The first heating process involves heating the protective material 300 covering the top of the electronic modules 200 to a first temperature. The first temperature is greater than or equal to the softening point of the protective material 300, and the first temperature is less than the solidifying point of the protective material 300. Therefore, the protective material 300 covering the top of the electronic modules 200 is softened, but is not solidified.

In the present embodiment, the timing of the first heating process and the timing of the gas decompression process need to be at least partially overlapped. In some embodiments, when the first heating process is performed, the gas decompression process may be performed at the same time via the pumping unit 130 of the apparatus 100. The gas decompression process involves reducing the gas pressure in the chamber 110 to a first ambient pressure, wherein the first ambient pressure is less than the gas pressure outside the chamber 110. Since the protective material 300 and the electronic modules 200 are adhered to each other via only a Van der Waals force or an electrostatic force, the gas decompression process may gradually discharge the gas in the gas gaps 20 between the protective material 300 and the electronic modules 200. Moreover, the protective material 300 covering the electronic modules 200 is softened by heating. As a result, the protective material 300 may be better adhered on the electronic modules 200.

In general, the first temperature may be adjusted according to the softening point of the protective material 300. In some embodiments, the first temperature is not only greater than or equal to the softening point of the protective material 300 but is greater than 50° C. As a result, if fine water droplets are present in the chamber 110, on the electronic modules 200, and/or on the protective material 300, then the fine water droplets may form water vapor via the first temperature greater than 50° C. under the first ambient pressure, and then may be discharged from the chamber 110 via the pumping unit 130 of the apparatus 100.

Refer to all of FIG. 1 to FIG. 3 and FIG. 4C. In step S3, a second heating process is performed on the protective material 300 in the chamber 110 after the protective material 300 is softened, and a boost process is performed on the chamber 110, wherein in the boost process, the gas in the chamber 110 directly pressurizes the protective material 300 such that the protective material 300 conformally covers the top of the electronic modules 200.

In the present embodiment, the second heating process may be performed via the heating unit 140 of the apparatus 100. The second heating process involves heating the protective material 300 covering the top of the electronic modules 200 to a second temperature. The second temperature is greater than the solidifying point of the protective material 300. Therefore, the protective material 300 covering the top of the electronic modules 200 is solidified as a result.

In the present embodiment, the timing of the second heating process and the timing of the boost process need to be at least partially overlapped. In some embodiments, when the second heating process is performed, the boost process may be performed at the same time via the boost unit 120 of the apparatus 100. The boost process involves increasing the gas pressure in the chamber 110 to a second ambient pressure, wherein the second ambient pressure is higher than the gas pressure outside the chamber 110. The protective material 300 covering the top of the electronic modules 200 is softened via heating, and almost no gas is present between the protective material 300 and the electronic modules 200. Therefore, the boost process may directly pressurize the softened protective material 300 covering the top of the electronic modules 200 via the gas in the chamber 110 such that the softened protective material 300 covering the top of the electronic modules 200 conformally covers the top of the electronic modules 200. Of course, a completely gas-free state is relatively difficult to achieve in a natural state (even in outer space), and therefore even if small gas gaps that may not be seen by the naked eye or are difficult to be observed are present between the protective material 300 and the electronic modules 200, this is still within the scope of "almost no gas is present between the protective material 300 and the electronic modules 200".

In some embodiments, via the boost unit 120 of the apparatus 100, the second ambient pressure may be greater than or equal to 0.8 megapascals (MPa), but the invention is not limited thereto.

In comparison to pressurizing using a mold or other similar mechanical pressurization methods, since in the invention, the protective material 300 conformally covers the top of the electronic modules 200 by a method of pressurizing via a high-pressure gas, even if the electronic modules 200 include a plurality of electronic components 220 of different sizes, the softened protective material 300 may still conformally cover the top of the electronic components 220 on the circuit board 210. Moreover, since the invention includes a method of pressurizing via a high-pressure gas, the electronic modules 200 or the protective material 300 conformally covering the top of the circuit board 210 is not damaged.

Refer to all of FIG. 1 to FIG. 3 and FIG. 4D. In step S4, the protective material 300 conformally covering the top of the electronic modules 200 is solidified to form the protective film 310 conformally covering the top of the electronic modules 200.

Figure 4D:
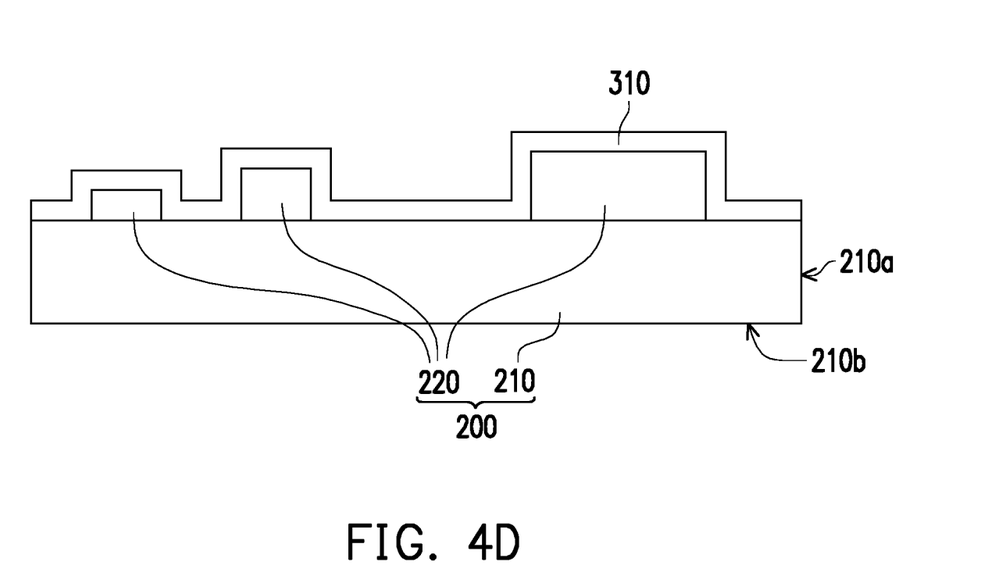

In the present embodiment, the second heating process involves heating the protective material 300 covering the top of the electronic modules 200 to a second temperature greater than the solidifying point of the protective material 300. Therefore, the protective material 300 conformally covering the top of the electronic modules 210 may be solidified to form the protective film 310 conformally covering the top of the electronic modules 200.

After step S1 to step S4, the method of forming the protective film 310 on the at least one electronic module 200 of the present embodiment is largely complete.

Of course, to remove the circuit board 210 for which the top is conformally covered by the protective film 310, cooling may be performed via the cooling unit 160 of the apparatus 100, or cooling may be performed via natural cooling. Moreover, after the gas pressure in the chamber 110 is reduced to substantially the same gas pressure outside the chamber 110 via the escape unit 150 of the apparatus 100, the circuit board 210 for which the top is conformally covered by the protective film 310 is removed.

The protective material 300 forming the protective film 310 does not need to cover the sidewall 210a or the bottom 210b of the circuit board 210. Therefore, the insulating protective film 310 may protect the electronic components 220 on the circuit board 210, and the portion not covered by the protective film 310 (such as the sidewall 210a or the bottom 210b of the circuit board 210) may still be electrically connected to the other electronic components 220.

In the forming process of the protective film using the protective material of the invention, the protective material conformally covers the top of the electronic modules by a method of pressurizing via a high-pressure gas. Therefore, the electronic modules and/or the protective film conformally covering the top of the circuit board is not readily damaged, and the electronic modules and/or the protective film conformally covering the top of the circuit board have good performance and good quality.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of forming a protective film on at least one electronic module, comprising:

disposing the at least one electronic module and a protective material disposed on a top of the at least one electronic module in a chamber, wherein the protective material and the at least one electronic module are in contact with each other, wherein an area of the at least one electronic module is greater than or equal to an area of the protective material, and in the step of disposing the at least one electronic module and the protective material disposed on the top of the at least one electronic module in the chamber, the protective material does not cover a sidewall of the at least one electronic module;

performing a first heating process on the protective material in the chamber to soften the protective material disposed on the at least one electronic module and performing a gas decompression process on the chamber, wherein:

the first heating process involves heating the protective material to a first temperature, the first temperature is greater than or equal to a softening point of the protective material, and the first temperature is less than a solidifying point of the protective material; and the gas decompression process involves reducing a gas pressure in the chamber to a first ambient pressure, wherein the first ambient pressure is less than a gas pressure outside the chamber;

performing a second heating process on the protective material in the chamber after the protective material is softened and performing a boost process on the chamber, wherein in the boost process, a gas in the chamber directly pressurizes the protective material such that the protective material conformally covers a top of the at least one electronic module, wherein:

the boost process involves increasing the gas pressure in the chamber to a second ambient pressure, wherein the second ambient pressure is higher than the gas pressure outside the chamber; and the second heating process involves heating the protective material to a second temperature, and the second temperature is greater than the solidifying point of the protective material; and the timing of the second heating process and the timing of the boost process need to be at least partially overlapped;

solidifying the protective material conformally covering the top of the at least one electronic module to form the protective film conformally covering the top of the at least one electronic module in the chamber;

after the protective film covering the top of the at least one electronic module being formed in the chamber, reducing the gas pressure in the chamber to the same gas pressure outside the chamber; and after reducing the gas pressure in the chamber to the same gas pressure outside the chamber, removing the at least one electronic module with the protective film from the chamber, wherein the protective film conformally and directly covers the top of the at least one electronic module for protecting thereof.

2. The method of claim 1, wherein each of the at least one electronic module comprises:
   a circuit board; and
   a plurality of electronic components disposed on the circuit board, and in the step of disposing the at least one electronic module and the protective material disposed on the at least one electronic module in the chamber, the protective material is at least in contact with the plurality of electronic components.

3. The method of claim 1, wherein the first temperature is greater than 50° C.

4. The method of claim 1, wherein the first heating process and the gas decompression process are performed at the same time.

5. The method of claim 1, wherein the second heating process and the boost process are performed at the same time.

6. The method of claim 1, wherein the chamber, a boost unit, a pumping unit, and a heating unit form an apparatus, wherein:
   the boost unit and the pumping unit are linked to the chamber; and
   the heating unit is thermally coupled to the chamber.

7. The method of claim 1, wherein the at least one electronic module is a plurality of electronic modules, and at least two of the plurality of electronic modules are overlapped with each other in the chamber.

* * * * *